United States Patent [19]
McKee et al.

[11] Patent Number: 5,830,270
[45] Date of Patent: Nov. 3, 1998

[54] CATIO₃ INTERFACIAL TEMPLATE STRUCTURE ON SEMICONDUCTOR-BASED MATERIAL AND THE GROWTH OF ELECTROCERAMIC THIN-FILMS IN THE PEROVSKITE CLASS

[75] Inventors: Rodney Allen McKee, Kingston; Frederick Joseph Walker, Oak Ridge, both of Tenn.

[73] Assignee: Lockheed Martin Energy Systems, Inc., Oak Ridge, Tenn.

[21] Appl. No.: 692,343

[22] Filed: Aug. 5, 1996

[51] Int. Cl.⁶ ................................................. C30B 25/14
[52] U.S. Cl. ........................ 117/106; 117/105; 117/108; 117/947; 427/255
[58] Field of Search ................................ 117/105, 106, 117/108, 947; 427/255, 255.3; 148/33

[56] References Cited

U.S. PATENT DOCUMENTS

| | | |
|---|---|---|
| 5,084,265 | 1/1992 | Harada et al. . |
| 5,225,031 | 7/1993 | McKee et al. . |
| 5,270,231 | 12/1993 | Sameshima . |
| 5,323,023 | 6/1994 | Fork . |
| 5,330,931 | 7/1994 | Emesh et al. . |
| 5,378,905 | 1/1995 | Nakamura . |
| 5,382,539 | 1/1995 | Nakamura . |
| 5,432,015 | 7/1995 | Wu et al. ................................. 428/690 |
| 5,496,597 | 3/1996 | Soininen et al. ......................... 427/584 |

OTHER PUBLICATIONS

Ligima et al., "Atomic Layer Growth of Oxide Thin Films With Provskile–type Structure by Reactive Evaporation," J. Appl. Phys 72(7) Oct. 1, 1992 pp. 2840–2845.

Tsuremi et al, "Fabrication of Borum Titanate/Strention Titanake Artifical Supperlattice by Atomic Layer Epitaxy" *Jpn. J. Appl. Phys.* vol. 33 (1994) pp. 5192–5195.

Robert M. Hazen, "Perovskites", *Scientific American*, pp. 74–81, Jun. 1988.

*Primary Examiner*—Robert Kunemund
*Attorney, Agent, or Firm*—Michael E. McKee

[57] ABSTRACT

A structure including a film of a desired perovskite oxide which overlies and is fully commensurate with the material surface of a semiconductor-based substrate and an associated process for constructing the structure involves the build up of an interfacial template film of perovskite between the material surface and the desired perovskite film. The lattice parameters of the material surface and the perovskite of the template film are taken into account so that during the growth of the perovskite template film upon the material surface, the orientation of the perovskite of the template is rotated 45° with respect to the orientation of the underlying material surface and thereby effects a transition in the lattice structure from fcc (of the semiconductor-based material) to the simple cubic lattice structure of perovskite while the fully commensurate periodicity between the perovskite template film and the underlying material surface is maintained. The film-growth techniques of the invention can be used to fabricate solid state electrical components wherein a perovskite film is built up upon a semiconductor-based material and the perovskite film is adapted to exhibit ferroelectric, piezoelectric, pyroelectric, electro-optic or large dielectric properties during use of the component.

33 Claims, 5 Drawing Sheets

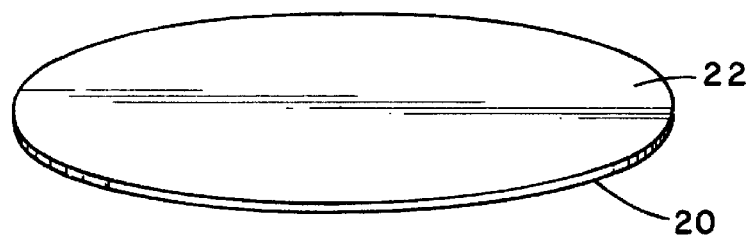
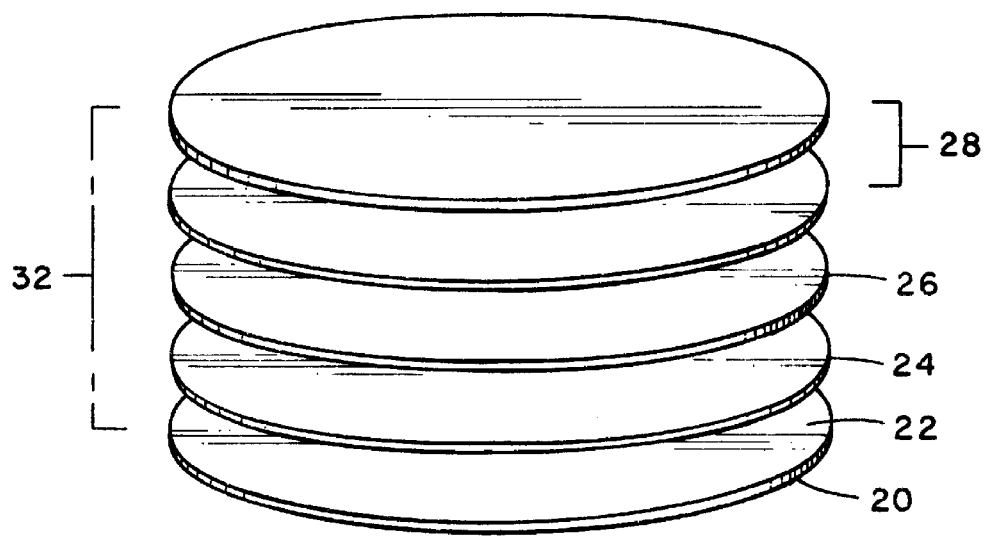
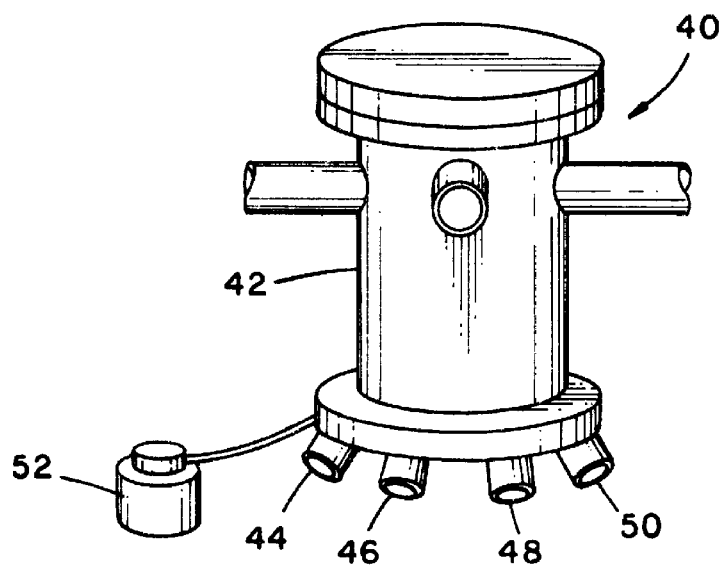

5,830,270

CATIO₃ INTERFACIAL TEMPLATE STRUCTURE ON SEMICONDUCTOR-BASED MATERIAL AND THE GROWTH OF ELECTROCERAMIC THIN-FILMS IN THE PEROVSKITE CLASS

BACKGROUND OF THE INVENTION

This invention relates generally to structures and the preparation of such structures for use in semiconductor and related applications and relates, more particularly, to the growth of epitaxial thin films upon semiconductor-based materials in the Group III-V, IV and II-VI classes such as, by way of example and not limitation, silicon or silicon-germanium alloys.

Electroceramic thin-films and, in particular, ferroelectric oxides are known to support the phenomenon of ferroelectricity and are believed to be useful in a wide range of applications such as nonvolatile memories, optical waveguides, and as a capacitor material in random access memories (RAM), dynamic random access memories (DRAM), electrically programmable read only memories (EPROM) and the like. For example, in epitaxially grown ferroelectric oxide layers wherein the crystallographic orientation of the layers is ordered, the orientation of the ferroelectric dipole moment is the basis for logic-state retention in nonvolatile memories. Thus, it would be desirable to integrate a ferroelectric oxide with a semiconductor-based substrate comprised, for example, of silicon or silicon-germanium to render a monolithic structure which possesses both semiconductor and ferroelectric properties.

In solid state electrical devices of the prior art, such as ferroelectric field effect transistors (FFETs) and capacitors or inactive gate transistors which incorporate a semiconductor material and a ferroelectric material, such as a perovskite having the general formula $ABO_3$, the devices are incapable of taking appreciable advantage of the ferroelectric and/or dielectric properties of the ferroelectric material. For example, the FFETs constructed to date have been unsatisfactory in performance, and the capacitors and inactive gate transistors constructed to date have been too leaky and thus incapable of holding a charge for a lengthy period of time. It would therefore be desirable to provide a solid state electrical device of this class which takes appreciable advantage of the ferroelectric and/or dielectric properties of the ferroelectric material incorporated therein.

Accordingly, it is an object of the present invention to provide a new and improved structure comprised of a crystalline electroceramic thin-film and a semiconductor-based substrate and a process for growing the thin-film upon the substrate.

Another object of the present invention is to provide such a structure which includes an $ABO_3$ material such as, by way of example and not limitation, a perovskite, and in particular a perovskite in the $BaTiO_3$ class, grown upon materials selected from the Group III-V, IV or II-VI classes of materials including, by way of example and not limitation, a silicon or silicon-germanium substrate wherein the grown perovskite is epitaxial and fully commensurate with the underlying material upon which it is grown.

Still another object of the present invention is to provide such a structure which utilizes a template structure interposed between the material surface of the Group III-V, IV or II-VI material forming the substrate and the desired $ABO_3$ material such as a perovskite for facilitating the fully commensurate growth of the desired $ABO_3$ material upon the substrate.

A further object of the present invention is to provide a new and improved solid state electrical component including a material adapted to exhibit ferroelectric, piezoelectric, pyroelectric, electro-optic or large dielectric properties during use of the component.

SUMMARY OF THE INVENTION

This invention resides in a monolithic crystalline structure and a process for growing an $ABO_3$ material, such as a perovskite, film onto the surface of a Group III, IV or II-VI semiconductor-based material wherein the material surface provided is, by way of example and not limitation, a face-centered-cubic (fcc) lattice structure like that of silicon or silicon-germanium.

The $ABO_3$ material has a lattice parameter which matches the semiconductor surface cube on cube or which closely approximates the quotient of the lattice parameter of the semiconductor surface divided by the square root of 2.0 and further has a crystalline form comprised of two constituent metal oxide planes comprised of AO and $BO_2$, respectively. When the metal elements A and B of crystalline form of the $ABO_3$ material are compared to one another, the element A provides a large cation in the crystalline structure of the $ABO_3$ material, and the element B provides a small cation in the crystalline structure of the $ABO_3$ material.

For example, in an $ABO_3$ material wherein the element B is the metal Titanium (Ti) (so that the $BO_2$ constituent plane is $TiO_2$), the Ti metal of the $TiO_2$ plane provides a small cation in the crystalline structure of the $ABO_3$ material, and the metal oxide of the constituent metal oxide plane AO includes the metal element A which provides the large cation in the crystalline structure of the $ABO_3$ material. In order to ensure commensurate periodicity during the buildup of the $ABO_3$ material, the formation of a single plane layer consisting of a metal oxide (such as, for example, AO) provided with a large cation is immediately followed by the deposition of a single plane layer consisting of a constituent metal oxide plane $BO_2$, rather than the constituent metal oxide plane AO.

In addition, the $ABO_3$ material of the epitaxial film is arranged upon the semiconductor surface so that a first single plane consisting of the oxide constituent AO is fully epitaxial and fully commensurate with the surface of the substrate, and a second single plane consisting of the other of the two constituent metal oxide planes (i.e. the oxide plane of $BO_2$) of the crystalline structure of the $ABO_3$ material is fully commensurate with the first single plane of AO and wherein the orientation of the $ABO_3$ material of the film is matched either cube on cube with the lattice structure of the substrate or is rotated 45° with respect to the orientation of the material surface of the substrate.

A process of the invention includes the steps of providing a substrate of semiconductor-based material having a surface which is provided by an fcc lattice structure like that of silicon or silicon-germanium, and positioning the substrate within an oxygen-free environment in an ultra-high vacuum facility. Then, an alkaline earth oxide is selected which has a lattice parameter which closely approximates the lattice parameter of the material surface of the semiconductor-based substrate, and then a film of the alkaline earth oxide is grown upon the material surface wherein the alkaline earth oxide film is at least one cell unit in thickness. An $ABO_3$ material, such as a perovskite, is subsequently selected which either has a lattice parameter closely approximating the lattice parameter of the semiconductor surface or the quotient of the lattice parameter of the semiconductor surface divided by the square root of 2.0. The $ABO_3$ material has a crystalline form comprised of two metal oxide planes wherein the metal oxide of one of the two metal oxide planes is comprised of $BO_2$ so that the element B of the $BO_2$ plane provides a small cation in the crystalline structure of the $ABO_3$ material and wherein the metal oxide of the other of the two metal oxide planes includes another metal which provides a large cation in the crystalline structure of the $ABO_3$ material. A single plane of AO is grown upon the alkaline earth oxide film wherein the AO of the single plane is epitaxial and fully commensurate with the semiconductor substrate, and then a single plane comprised of the other of the two metal oxide planes (i.e. the oxide $BO_2$) of the perovskite crystalline structure of the $ABO_3$ material is grown upon the AO plane so that the metal oxide of the other of the two metal oxide planes is epitaxial and fully commensurate with the AO plane and wherein the orientation of the grown $ABO_3$ material is either oriented cube on cube with respect to the surface of the substrate or is rotated 45° with respect to the surface of the substrate so that (001) perovskite is parallel to (001) semiconductor surface and [100] perovskite is parallel to [110] semiconductor surface.

In one aspect of the invention, the structure is formed by the process of the invention, and in another aspect of the invention, the structure is in the form of a ferroelectric field-effect (FFET) transistor including a base substrate of silicon, a source electrode, a drain electrode, a gate electrode, and a gate dielectric interposed between the silicon and the gate electrode. In the FFET, the improvement is characterized in that the gate dielectric includes an epitaxial thin film layer of a perovskite oxide interposed between the silicon and the remainder of the gate dielectric. The construction process used to build up the FFET avoids any tendency for undesirable silicon dioxide ($SiO_2$) to form at the interface of the silicon and the gate dielectric.

BRIEF DESCRIPTION OF THE DRAWINGS

FIG. 1 is a perspective view of a silicon wafer upon which a single crystal film of the perovskite $BaTiO_3$ can be grown in accordance with the method of the present invention.

FIG. 2 is an exploded perspective view of a structure within which a perovskite film is grown upon a silicon substrate and illustrating schematically the successive layers of constituents comprising the structure.

FIG. 3 is a schematic perspective view of a fragment of the ultra high vacuum equipment with which steps of the process of the present invention can be performed.

DETAILED DESCRIPTION OF ILLUSTRATIVE EMBODIMENTS

Figure 4:
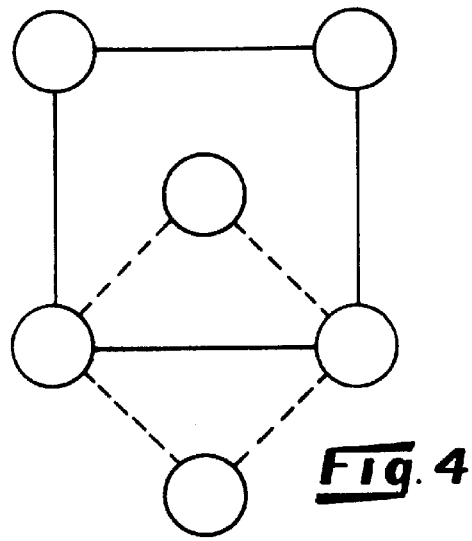
FIG. 4 is a plan view illustrating schematically the orientation of the lattice structures of adjacent constituent layers of the FIG. 2 structure.

The present invention truncates silicon with a stable perovskite structure permitting growth of a thin-film ferroelectric material on silicon as a monolithic structure. It is a member of our general series of commensurate structures designated as $(AO)_n(A'BO)_m$ in which n and m are the integer repeats of single plane commensurate oxide layers. If n=1, then the perovskite is grown directly as $ABO_3$ from the silicide truncation of silicon beginning at the AO plane. If n>1, the face-centered NaCl-type structure is grown at the interface then truncated with the $BO_2$ plane to transistion to the perovskite structure.

With reference to FIG. 1, there is illustrated a wafer or substrate 20 having a surface 22 upon which a single crystal film of a material having the general formula $ABO_3$, such as a perovskite (e.g. $BaTiO_3$), can be grown to produce a monolithic structure embodying features of the structure of the present invention. The substrate 20 is preferably of a semiconductor-based material such as silicon or a silicon-germanium alloy, but the substrate may be selected from group consisting of Group IV, Group III-V and II-VI semiconductors.

The crystalline form of the $ABO_3$ material includes a first single constituent oxide plane having the general formula AO and a second constituent oxide plane having the general formula $BO_2$. While the element O of the formula $ABO_3$ is understood to be oxygen, the element A may be a material found in Group IA, IIA or IVB of the periodic table of the elements, while the element B may be a material found in Group III, IVA or VA of the periodic table. When the metal elements A and B of crystalline form of the $ABO_3$ material are compared to one another, the element A provides a large cation in the crystalline structure of the $ABO_3$ material, and the element B provides a small cation in the crystalline structure of the $ABO_3$ material.

Briefly, during the build up of the desired $ABO_3$ upon the substrate surface 22, a first epitaxial and fully commensurate film of an alkaline earth oxide (having the general formula AO and a sodium chloride-type crystal lattice structure) is grown upon the substrate surface 22, a second film (of a desired $A'BO_3$ material) is grown upon the first film, and a third film (of the desired $A'BO_3$ material) is grown upon the second film. The element A' of the $A'BO_3$ material may, where AO is a single atomic layer, be the same element A of the alkaline earth oxide AO having the sodium chloride-type lattice structure but may, in other instances, be an element other than the element A. Therefore, the formula $A'BO_3$ appropriately is designated $A'BO_3$ to differentiate, where in the case of a single atomic layer of AO, the element A of the alkaline earth oxide AO is different from the element A' of the constituent oxide A'O of the $A'BO_3$ material. It will therefore be understood that in the interests of the present invention, the element A' of the formula $A'BO_3$ material can consist of, but is not limited to, the element A of the alkaline earth oxide AO.

As the aforedescribed structure is grown, the orientation of the crystalline form of the second film being grown is either grown cube on cube or is rotated 45° with respect to the orientation [e.g. (001) truncation] of the first (alkaline earth oxide) film to facilitate the epitaxial and fully commensurate build-up of the third film upon the second film. Therefore and as will be apparent herein, the first (alkaline earth oxide) film serves as a template upon which the second film (of A'BO$_3$ material) is grown, and the second film serves as a template upon which the desired third film (of A'BO$_3$ material) is grown.

By way of example and not as limitation, the specific monolithic structure described herein involves a substrate 20 of semiconductor-based material comprised of silicon, an alkaline earth oxide (AO) film comprised of Ba$_{0.725}$Sr$_{0.275}$O, and an A'BO$_3$ material comprised of the perovskite CaTiO$_3$ or, more specifically, perovskites of the CaTiO$_3$ class. While the material of the substrate 20 is generally characterized by a face-centered-cubic (fcc) lattice structure, such as silicon and silicon-germanium alloys, the alkaline earth oxide (AO) material includes a sodium chloride-type lattice structure, and the perovskites of the CaTiO$_3$ class are generally characterized by a simple cubic lattice structure. It will be understood, however, that the principles of the present invention can be used to build up thin-films of other A'BO$_3$ materials upon a substrate of another semiconductor-based material, such as a silicon-germanium alloy.

The techniques described herein to construct the desired resultant monolithic structure are molecular beam epitaxy (MBE) techniques. It will be understood, however, that the described MBE techniques are intended for the purpose of illustration and not as limitation. For example, alternative methods, such as chemical vapor deposition (CVD) and metal organic chemical vapor deposition (MOCVD), can be employed. Accordingly, the principles of the present invention can be variously applied.

As is described herein in accordance with an embodiment of the method of the present invention and with reference to FIG. 2, steps are taken to cover the surface 22 with a thin alkaline earth oxide film 24 of Ba$_{0.725}$Sr$_{0.275}$O, then to cover the film 24 with a thin perovskite (template) film 26 of Ca$_{0.64}$Sr$_{0.36}$TiO$_3$, and then to cover the film 26 with a desired (multi-stratum) perovskite film 28 of a perovskite of the BaTiO$_3$ class to provide a resultant structure 32. Each of the alkaline earth oxide film 24 and the template film 26 and an appreciable portion of the perovskite film 28 are constructed in somewhat of a single plane-layer-by-single plane-layer fashion, described herein, to ensure commensurate periodicity throughout the build up of each film and wherein the layer-construction processes take into account the crystalline form of the material out of which the film is desired to be constructed. Furthermore, the film-growing processes described herein take advantage of the lattice matching that exists at the interface of adjacent films of the structure 32. To this end, the lattice structures at the interface of adjacent films have parameters which are matched so that the likelihood of any appreciable lattice strain at the film/film interface is significantly reduced. Moreover, the growth process described herein avoids any propensity for silica (SiO$_2$) to form as an amorphous component of the interface template structure.

Unlike the face-centered-cubic (fcc) crystalline lattice structure of the semiconductor-based substrate 22, the crystalline lattice form of perovskite is a simple cubic structure and its crystalline (i.e. cube) form includes a plane of a Group IVA element oxide, i.e. an oxide of a group consisting of TiO$_2$, ZrO$_2$ and HfO$_2$, and another plane of a different metal oxide. For example and as discussed in U.S. Pat. No. 5,450,812, having the same inventors as the instant application and the disclosure of which is incorporated herein by reference, the crystalline lattice structure of the perovskite BaTiO$_3$ includes a plane of TiO$_2$ and a plane of BaO. Similarly, the crystalline form of the perovskite SrTiO$_2$ includes a plane of TiO$_2$ and a plane of SrO.

At the outset of a process performed in accordance with the method of the present invention, the surface 22 of the silicon substrate 20 is cleaned to atomic cleanliness so that only silicon atoms are present at the surface 22. To this end, the surface 22 is cleaned by a process commonly referred to as a Modified RCA technique. The Modified RCA technique is a well-known process involving the chemical production of an oxide at a silicon surface being cleaned and subsequently placing the surface in a high vacuum environment and raising the temperature of the surface to sublime the oxide off of the surface. (This same surface-cleaning procedure is followed if the substrate 20 is comprised of a silicon-germanium alloy.)

The layers of the desired structure 32 are built up in this example by molecular beam epitaxy (MBE), electron beam evaporation techniques and with MBE equipment. The MBE equipment includes an ultra high vacuum (UHV) growth/characterization facility, a fragment of which is indicated 40 in FIG. 3. The facility 40 includes a container 42 having an inner chamber within which the substrate 20 is positioned so that its surface 22 faces downwardly, and a plurality of canisters 44, 46, 48 and 50 are provided within the base of the container 42 for providing a vapor source of metals desired to be added to the substrate surface 22 during the formation of the structure 32. In this connection, each canister 44, 46, 48 and 50 is adapted to hold a crucible containing a desired metal and contains heating elements for vaporizing the metal. An opening is provided in the top of each canister, and a shutter is associated with the canister opening for movement between a closed condition at which the interior of the container is closed and thereby isolated from the substrate surface 22 and an opened condition at which the contents of the container, i.e. the metal vapors, are exposed to the substrate surface 22.

In the depicted facility 40, an amount of the metal barium (Ba) is positioned within the canister 44, an amount of strontium (Sr) is positioned within the canister 46, an amount of calcium (Ca) is positioned within the canister 48, and an amount of titanium (Ti) is positioned within the canister 50. In addition, an oxygen source 52 is connected to the chamber so that by opening and closing a valve associated with the source 52, oxygen can be delivered to or shut off from the chamber. The opening and closing of each canister shutter and the oxygen source valve is accurately controlled by a computer controller (not shown).

Another feature of the facility 40 is that a closable substrate shutter is disposed immediately below the downwardly-directed face of the substrate surface 22 for isolating, when desired, the substrate surface 22 from exposure to the metal vapors from the canisters or the oxygen from the oxygen source 52 while the internal pressure of the facility chamber is raised with the oxygen from the source 52. The substrate shutter is closed during one step of the present process as will be apparent herein.

The vacuum drawn in the UHV facility 40 to complete the Modified RCA cleaning technique upon the substrate 20 is between about $10^{-9}$ and $10^{-10}$ torr, and the substrate 20 is heated to raise the substrate temperature to a temperature sufficient to drive the oxides off of the surface 22. In practice, such a temperature may be between about 850° and 1050° C., and the desired surface cleanliness may be confirmed in-situ during the substrate heating operation by Reflection High Energy Electron Diffraction (RHEED) techniques. For present purposes, the silicon substrate 20 reaches atomic cleanliness upon the development of 2×1 Si(100) at the surface 22 as evidenced by RHEED analysis.

Upon reaching the desired atomic cleanliness and to initiate the growth of the first film 24 of the alkaline earth oxide, a mixture of a predetermined amount of Barium (Ba) metal and a predetermined amount of Strontium (Sr) metal is deposited upon the substrate surface 22 so that a fraction, e.g. about one-fourth, of a monolayer of the mixture covers the substrate surface 22. In other words, the Ba and Sr metal mixture is deposited upon the substrate surface 22 until about one atom of the mixture overlies the silicon surface 22 for every four atomic sites of Si. To this end, Ba vapor and Sr vapor is created in the corresponding canisters and the corresponding canister shutters are opened to expose the clean substrate surface 22 to the Ba and Sr mixture.

The ratio of Ba to Sr in the Ba/Sr vapor mixture is selected with regard to the lattice parameter of the silicon structure (or, in the alternative, the silicon-germanium structure) of the substrate surface 22. In particular, the lattice parameter of the silicon structure is known to be 0.543 nm, and the lattice parameter of the structure of a $Ba_xSr_{1-x}O$ compound (formed upon the substrate surface 22 in a manner described herein) is selected to closely match that of the silicon structure so that when epitaxially covering the silicon surface 22, no appreciable strain exists at the $Si/Ba_xSr_{1-x}O$ interface. In this connection, it is also known that the lattice parameter of $Ba_xSr_{1-x}O$ varies substantially linearly as the ratio of Sr to Ba is increased in this compound from 0.0% to 100%. Thus, when the variable "x" in this compound equals 1.0, the lattice parameter of the compound is 0.554 nm (corresponding with the lattice parameter of pure BaO), and when the variable "x" in the compound equals 0.0, the lattice parameter of the compound equals 0.514 nm (corresponding with the lattice parameter of pure SrO).

In the depicted example, the ratio of Ba to Sr in the $Ba_xSr_{1-x}O$ compound is selected to provide a lattice parameter of the $Ba_xSr_{1-x}O$ compound which exactly matches the lattice parameter of silicon or, in other words, is selected to provide the $Ba_xSr_{1-x}O$ compound with a lattice parameter of 0.543 nm. To this end, the variable "x" in the this compound equals 0.725 so that the proportion of BaO to SrO in the oxide compound eventually formed upon the substrate surface 22 is 0.725 to 0.275.

In an alternative example in which the substrate 22 is comprised of silicon-germanium ($Si_yGe_{1-y}$), the ratio of Ba to Sr in the $Ba_xSr_{1-x}O$ compound is selected to provide a lattice parameter of the $Ba_xSr_{1-x}O$ compound which exactly matches the lattice parameter of $Si_yGe_{1-y}$. If, for example, the substrate 22 was comprised of $Si_{0.80}Ge_{0.20}$ which has a lattice parameter of 0.548 nm, the variable "x" in the aforementioned $Ba_xSr_{1-x}O$ compound is selected to equal 0.85 so that the proportion of BaO to SrO in the oxide compound eventually formed upon the substrate surface 22 is 0.85 to 0.15 to provide the $Ba_xSr_{1-x}O$ compound with a lattice parameter of 0.548 nm.

For a more detailed description of the lattice matching between adjacent films for the purpose of reducing lattice strain at a film/film interface of an epitaxial layup of films, reference can be had to U.S. Pat. No. 5,482,003, having the same inventors as the instant application and the disclosure of which is incorporated herein by reference.

Accordingly and with regard again to the exemplary substrate 22 comprised of pure silicon, in the process step described herein in which the Ba and Sr metals are deposited upon a substrate of silicon so as to form a submonolayer thereon involves the exposure of the substrate surface 22 to a mixture of Ba and Sr vapors wherein the ratio of Ba to Sr in the mixture is 0.725 to 0.275. Such exposure can be effected with the facility 40 by either of two methods. One method involves the production of a flux vapor of Ba and a flux vapor of Sr from the canisters 44 and 46 containing Ba and Sr, respectively, so that the combined vapor fluxes emitted from the canisters provide the desired, i.e. target, ratio of Ba to Sr in the Ba/Sr vapor mixture. The other method involves the control of the amount of time that the shutters of the Ba and Sr-containing canisters are opened so that the appropriate amount of Ba and Sr vapors are emitted from the corresponding canisters and become mixed in the facility 40. In either event, the techniques used to produce a mixture of metal vapors in the facility 40 wherein the vapor mixture contains a desired ratio of one metal vapor to another metal vapor involve techniques which are known and common to MBE so that the desired Ba to Sr in a mixture of Ba and Sr vapors can be achieved in the facility with a high degree of accuracy.

Upon completion of the deposition of the desired fraction of the monolayer of Ba and Sr atoms upon the substrate surface 22, the substrate 20 is cooled to between about room temperature and 150° C. while the high vacuum environment is maintained about the substrate 20, and the remainder of one monolayer of Ba and Sr is then deposited upon the substrate surface. To this end, the shutters of the canisters of Ba and Sr can be opened for an appropriate period of time sufficient for the desired mixture of Ba and Sr vapor (wherein the ratio of Ba to Sr in the vapor mixture is 0.725 to 0.275) is exposed to the substrate. By cooling the substrate 20 to the lower temperature, i.e. between about room temperature and 150° C., the attachment of Ba and Sr atoms to the substrate surface is promoted because the added Ba and Sr atoms remain in a metallic state and do not form silicide at or below these lower temperatures.

As has been addressed in earlier U.S. Pat. No. 5,225,031, having the same inventors as the instant application and the disclosure of which is incorporated herein by reference, the purpose for developing the monolayer of Ba and Sr atoms at the Ba/Sr interface is to form a stable template surface upon which a subsequent epitaxial layer of $Ba_{0.725}Sr_{0.275}O$ is grown. Thus, with the stable monolayer of $Ba_{0.725}Sr_{0.275}O$ formed upon the Si surface, $Ba_{0.725}Sr_{0.275}O$ can be grown epitaxially upon the silicon in such a manner as to avoid the formation of amorphous silica. To this end, the substrate shutter is closed to prevent exposure of the substrate surface 20 to the facility chamber contents, and the pressure of the chamber is raised to about 1 to $5 \times 10^{-6}$ torr of oxygen while maintaining Ba and Sr vapor source operations that would be needed to deposit Ba and Sr metal upon the substrate surface at a predetermined rate and in the desired, or target, proportions of Ba to Sr. Upon reaching the target oxygen pressure, e.g. $1 \times 10^{-6}$ torr, the substrate shutter is opened to expose the Ba and Sr-coated surface of the substrate to oxygen and additional Ba and Sr atoms. Upon such exposure, $Ba_{0.725}Sr_{0.275}O$ begins to grow epitaxially upon the Ba and Sr-coated surface.

By appropriately opening and closing off the exposure of the substrate surface to the Ba and Sr metals and oxygen by cyclically exposing the substrate surface to the Ba and Sr metals and oxygen, $Ba_{0.725}Sr_{0.275}O$ is grown upon the substrate surface one atomic layer at a time. Such a growth pattern is continued until the monolayers of $Ba_{0.725}Sr_{0.275}O$ develop sufficient stability to prevent the formation of an amorphous silicate. It has been found that such stability is achieved upon the formation of a $Ba_{0.725}Sr_{0.275}O$ thickness of about 1.0 nm (equivalent to about two cell units high), and it is at this thickness of two cell units that the growth of the film 24 is halted and the growth of the subsequent film 26 is initiated.

In other words, upon formation of the stable film 24 (of two cell units in thickness) of $Ba_{0.725}Sr_{0.275}O$ upon the substrate surface 22, steps are taken to form the desired template film 26 of $Ca_{0.64}Sr_{0.36}TiO_3$ upon the film 24. Whereas the ratio of Ba to Sr in the film 24 of $Ba_xSr_{1-x}O$ is selected for its lattice match to that of the underlying silicon of the surface 22, the ratio of Ca to Sr in the film 26 of $Ca_xSr_{1-x}TiO_3$ is selected for its lattice match to that of the underlying film 24 of $Ba_{0.725}Sr_{0.275}O$. However, whereas the film 24 is grown epitaxially upon and is fully commensurate with the silicon surface 22 so that its lattice orientation matches that of the silicon surface 22, the crystalline form of the $Ca_{0.64}Sr_{0.36}TiO_3$ film 26 (which is also epitaxial and fully commensurate with the underlying film 24) has an orientation which is rotated 45° with respect to the orientation of the crystalline form of the underlying $Ba_{0.725}Sr_{0.275}O$ film 24. As will be apparent herein, the build-up of the film 26 upon the film 24 effects a change in the lattice structure of the construction from fcc (i.e. of the underlying semiconductor-based material) to the simple cubic lattice structure of a perovskite (i.e. $Ca_{0.64}Sr_{0.36}TiO_3$) while the perovskite build-up is fully commensurate with the underlying semiconductor-based material, and this build-up process is advantageous in this respect.

In this connection, $CaTiO_3$ and $SrTiO_3$ are mutually soluble with one another and each has a cubic phase with a continuously variable lattice parameter from 0.380 nm for $CaTiO_3$ to 0.391 nm for $SrTiO_3$. With this in mind, the crystalline structure of the compound $Ca_xSr_{1-x}TiO_3$ wherein x=0.64 yields a lattice parameter of 0.384 nm, and this lattice parameter matches, with a 45° rotation, the [110] spacing of silicon (0.384 nm). Such a match of the $Ca_{0.64}Sr_{0.36}TiO_3$ lattice structure atop the $Ba_{0.725}Sr_{0.275}O$ lattice structure is depicted in the plan view of FIG. 4 wherein the $Ba_{0.725}Sr_{0.275}O$ lattice structure (having a lattice parameter of 0.543 nm) is depicted in solid lines in FIG. 4 and the $Ca_{0.64}Sr_{0.36}TiO_3$ lattice structure (having a lattice parameter of 0.384 nm) is depicted in phantom in FIG. 4. It follows that the desired lattice parameter of the $Ca_{0.64}Sr_{1-x}TiO_3$ crystal is the quotient of the lattice parameter of the underlying $Ba_{0.725}Sr_{0.275}O$ crystal (0.543 nm) divided by the square root of 2.0 (i.e. approximately 1.414).

The above-discussed 45° rotation of the orientation of the lattice structure grown atop another lattice structure has been proven by growing a sample of $Ca_xSr_{1-x}TiO_3$ on BaSrO/Si in a growth sequence: $TiO_2/CaSrO/TiO_2/CaSrO/$ ... Reflection high energy electron diffraction (RHEED) from the (001) surfaces of the initial Si compared with the (001) face of $CaTiO_3$ show that epitaxy does develop with the expected 45° rotation so that (001) $CaTiO_3$ is parallel to (001) silicon and [100] $CaTiO_3$ is parallel to [110] silicon. The alloyed and lattice matched $Ca_xSr_{1-x}TiO_3$ thin films are stable after growth as thin as 3 unit cells (less than 1.2 nm).

To grow the desired template perovskite film 26 of $Ca_{0.64}Sr_{0.36}TiO_3$ upon the film 26, steps are taken which correspond to those set forth in the earlier-referenced U.S. Pat. No. 5,450,812. Briefly and keeping in mind that the crystalline form of the perovskite structure $Ca_{0.64}Sr_{0.36}TiO_3$ includes a plane of $TiO_2$ and a plane of $Ca_{0.64}Sr_{0.36}O$, single planes of $TiO_2$ and $Ca_{0.64}Sr_{0.36}O$ are grown in an alternating fashion (starting with a single plane of $TiO_2$) upon the $BaO_{0.725}Sr_{0.275}O$ film 24 until the desired thickness of the film 26 is obtained.

In preparation of the growth of an initial $TiO_2$ plane of the film 26, the pressure in the UHV chamber is adjusted to (or maintained) between about $2–5\times10^{-7}$ torr. The desired plane of $TiO_2$ is then built upon the MgO surface by conventional MBE techniques while the internal pressure of the facility 40 is maintained between about $2–5\times10^{-7}$ torr. For example, Ti metal vapor could initially be deposited upon the $Ba_{0.725}Sr_{0.275}O$ surface and then oxygen from the source 40 could be released over the surface so that the desired layer of $TiO_2$ is formed at the $Ba_{0.725}Sr_{0.275}O$ surface. Alternatively, the $Ba_{0.725}Sr_{0.275}O$ surface could be simultaneously exposed to Ti vapor and oxygen, in controlled amounts, so that $TiO_2$ forms and then accumulates on the $Ba_{0.725}Sr_{0.275}O$ surface.

During either of the aforementioned deposition processes involving the $TiO_2$ layer, careful control of the MBE operation is maintained to ensure that no more than a single plane-layer, i.e. one plane, of $TiO_2$ is deposited upon the $Ba_{0.725}Sr_{0.275}O$ surface. The bulk form of the compound $TiO_2$, as characterized by the ordered surface structure formed in this step, has a non-equilibrium structure and is not found in nature, and there exists a tendency for the formed $TiO_2$ to accumulate into clusters if the $Ba_{0.725}Sr_{0.275}O$ surface is exposed to a greater amount of $TiO_2$ than is needed to comprise a single plane of $TiO_2$. Of course, if such clusters develop, the $TiO_2$ layer looses its order, and the ability to grow ordered layers upon the $TiO_2$ layer is destroyed. Thus, careful control must be maintained over the deposition of Ti vapor and the release of oxygen from the source 40 so that a single plane, and only a single plane, of $TiO_2$ accumulates at ordered sites upon the $Ba_{0.725}Sr_{0.275}O$ surface (i.e. directly contacts and is fully commensurate with the $Ba_{0.725}Sr_{0.275}O$ surface.

Following the development of the desired initial (single plane) layer of $TiO_2$ upon the $Ba_{0.725}Sr_{0.275}O$ surface, a (single plane) layer of $Ca_{0.64}Sr_{0.36}O$ which comprises the other plane of the perovskite $Ca_{0.64}Sr_{0.36}TiO_3$ is grown upon the $TiO_2$ layer. To this end, conventional MBE techniques are used to grow the desired $Ca_{0.64}Sr_{0.36}O$ layer epitaxially upon and fully commensurate with the formed $TiO_2$ layer. For example, the metal vapors Ca and Sr may be initially deposited upon the $TiO_2$ surface in the desired proportions, i.e. 0.64 to 0.36, and then the oxygen may be subsequently released into the chamber so that the $Ca_{0.064}Sr_{0.36}O$ forms upon the $TiO_2$ surface. Alternatively, the $TiO_2$ layer could be simultaneously exposed to Ca and Sr vapors and oxygen so that $Ca_{0.64}Sr_{0.36}O$ accumulates on the $TiO_2$ layer. In either event, careful control should be maintained over the deposition operation here so that one plane, and no more than one plane, of the desired layer of $Ca_{0.64}Sr_{0.36}O$ is developed at this stage upon the $TiO_2$ layer.

Upon formation of the desired plane of $Ca_{0.64}Sr_{0.36}O$, a second plane of $TiO_2$ is grown upon the $Ca_{0.64}Sr_{0.36}O$ plane in accordance with the aforedescribed techniques used to grow $TiO_2$ onto the $Ba_{0.725}Sr_{0.275}O$ surface. Then, upon formation of the desired second plane of $TiO_2$, a second plane of $Ca_{0.64}SrO_{0.36}O$ is grown upon the second plane of $TiO_2$.

Thereafter, single plane-layers of $TiO_2$ and $Ca_{0.64}Sr_{0.36}O$ are formed in an alternating fashion until at least about three cell units of the desired $CaSrTiO_3$ perovskite are grown upon the $Ba_{0.725}Sr_{0.275}O$ surface. It has been found that the alloyed and latticed matched $Ca_{0.64}Sr_{0.36}TiO_3$ film is stable after growth as thin as three unit cells (1.2 nm) is obtained. Accordingly, the growth of the film 26 is halted upon the obtaining of a thickness of the film 26 of three unit cells.

Once the desired template film 26 of $Ca_{0.64}Sr_{0.36}TiO_3$ is formed, steps are taken to grow the desired perovskite film 28 upon the film 26. In the embodiment of the method described herein and as mentioned earlier, the perovskite of the film 28 is $BaTiO_3$, and steps can be taken to grow the $BaTiO_3$ directly upon the film 26, but as will be discussed herein, there exists alternative schemes by which a film of $BaTiO_3$ is ultimately obtained.

To grow $BaTiO_3$ directly upon the template film 26, steps are taken to grow $BaTiO_3$ in a single plane-layer-by-single plane-layer, i.e. a constituent plane-by-constituent plane, fashion until a critical cell unit height is achieved or, in other words, until lattice strain ceases to appear at the surface of the layup of planes. In this connection and keeping in mind that the cubic crystalline form of $BaTiO_3$ is comprised of a plane of $TiO_2$ and a plane of the metal oxide BaO, an initial film layer comprised of a single plane of $TiO_2$ is grown epitaxially upon the surface of the $Ca_{0.64}Sr_{0.36}TiO_3$ film 26. As discussed above in connection with the growth of a $TiO_2$ plane of the film 24 and while maintaining the internal pressure of the facility 40 between about $2-5\times10^{-7}$ torr, Ti metal vapor could initially be deposited upon the $Ca_{0.64}Sr_{0.36}TiO_3$ surface and then oxygen from the source 40 could be released over the surface so that the desired layer of $TiO_2$ is formed thereon. Alternatively, the $Ca_{0.64}Sr_{0.36}TiO_3$ surface could be simultaneously exposed to Ti vapor and oxygen, in controlled amounts, so that $TiO_2$ forms and then accumulates on the $Ca_{0.64}Sr_{0.36}TiO_3$ surface. As has been described in connection with the aforementioned deposition processes involving a single plane-layer of $TiO_2$, careful control of the MBE operation is maintained to ensure that no more than one plane of $TiO_2$ is deposited directly upon the $Ca_{0.64}Sr_{0.36}TiO_3$ surface.

Following the development of the desired layer of $TiO_2$ upon the $Ca_{0.64}Sr_{0.36}TiO_3$ surface, a (single plane) layer of BaO which comprises the other plane of the crystalline structure of the perovskite $BaTiO_3$ is grown upon the initial $TiO_2$ plane. As is the case with the formation of the plane of metal oxide $Ca_{0.64}Sr_{0.36}TiO_3$ of the film 26, the metal oxide BaO can be grown directly upon the $TiO_2$ plane by conventional MBE techniques. For example, the metal vapor Ba may be initially deposited upon the $TiO_2$ surface, and then the oxygen may be subsequently released into the chamber so that the metal oxide BaO forms upon the $TiO_2$ surface. Alternatively, the $TiO_2$ layer could be simultaneously exposed to metal vapor and oxygen so that the metal oxide BaO accumulates on the $TiO_2$ layer. Again, careful control should be maintained over the deposition operation here so that one plane, and no more than one plane, of the desired metal oxide BaO is developed at this stage upon the $TiO_2$ layer and so that the pattern of metal oxide deposited upon the $TiO_2$ layer is epitaxial and fully commensurate with the $TiO_2$ of the $TiO_2$ layer.

Upon formation of the desired plane of metal oxide BaO, another plane of $TiO_2$ is grown upon the metal oxide plane in accordance with the aforedescribed techniques used to grow $TiO_2$ upon the $Ca_{0.64}Sr_{0.36}TiO_3$ surface of the film 24. Upon formation of the desired another plane of $TiO_2$, another plane of the metal oxide BaO is grown upon the second plane of $TiO_2$.

Thereafter, single plane-layers of $TiO_2$ and BaO are formed in an alternating fashion until a critical thickness of the desired perovskite $BaTiO_3$, corresponding in this instance to a cell unit height of at least about twelve cell units, is grown upon the film 24. In other words, dislocations which may develop within the formed layers nucleate so as to provide internal strain relief within about the first twelve cell units so that lattice strain does not appear at the surface of the layup of planes. Thus, the surface defined by the twelfth cell unit is ordered and substantially free of strain.

Once the strain-free surface of perovskite is formed, steps can be taken to grow additional layers of the perovskite $BaTiO_3$ upon the build up of cell units. In this connection, subsequent growth of the perovskite upon its strain-free bulk form is homoepitaxial, rather than heteroepitaxial so that the characteristics of the interface between adjacent layers of $TiO_2$ and the metal oxide BaO are not likely to present problems during growth. Thus, the perovskite can be built upon itself in layers which are each one cell unit in height after the initial twelve cell units of the perovskite are formed. To this end, the perovskite $BaTiO_3$ is grown single cell-layer-by-single cell-layer upon the strain-free surface by conventional MBE techniques so that each layer grown during this stage is one cell unit high. For example, the strain-free surface of perovskite may initially be exposed to Ti and the metal Ba vapors and then to oxygen so that the perovskite forms upon the strain-free surface. Alternatively, the strain-free surface can be exposed simultaneously to the Ti and Ba vapors and oxygen so that the perovskite forms and then settles upon the strain-free surface. Still further, known co-deposition techniques (e.g. other than MBE processes) can be employed to grow the perovskite in this stage of the growth process. In either instance, careful control of the build up process is maintained so that the build up of successive layers of the perovskite is effected epitaxially.

As an alternative to growing $BaTiO_3$ directly upon the film 26 of $Ca_{0.64}Sr_{0.36}TiO_3$, an intermediate perovskite film of $Ba_xSr_{1-x}TiO_3$ can be grown upon the film 26, wherein the variable "x" in the composition is chosen so that the lattice parameter of the perovskite crystalline structure is closer to that, i.e. 0.384 nm, of the underlying $Ca_{0.64}Sr_{0.36}TiO_3$ perovskite film than is the lattice parameter of $BaTiO_3$ (which is 0.4 nm). To this end, the variable "x" in the $Ba_xSr_{1-x}TiO_3$ compound is chosen to be 0.725.

To grow $Ba_{0.72}Sr_{0.36}TiO_3$ upon the film 26 and keeping in mind that the crystalline structure of this perovskite includes a single plane of $TiO_2$ and a single plane of $Ba_{0.725}Sr_{0.275}O$, an initial film layer comprising a single plane of $TiO_2$ is grown epitaxially upon the surface of the $Ca_{0.64}Sr_{0.36}TiO_3$ film 26. The aforedescribed conventional MBE techniques can be used to grow the initial film layer of $TiO_2$. Of course and has been described in connection with the build up of the $Ca_{0.64}Sr_{0.36}TiO_3$ and $BaTiO_3$ films, careful control of the MBE operation is maintained during the build up of this initial single plane-layer of $TiO_2$ to ensure that one plane, and no more than one plane, of $TiO_2$ is grown upon the $Ca_{0.64}Sr_{0.36}TiO_3$ surface.

Subsequent to the build up of the initial $TiO_2$ plane, $Ba_{0.725}Sr_{0.275}O$ which comprises the other plane of the perovskite $Ba_{0.725}Sr_{0.275}TiO_3$ is formed upon the single plane layer of $TiO_2$. To this end, conventional MBE techniques are used to grow the desired $Ba_{0.725}Sr_{0.275}O$ layer upon the formed $TiO_2$ layer. For example, the metal vapors Ba and Sr may be initially deposited upon the $TiO_2$ surface in the appropriate ratio 0.725 to 0.275, and then the oxygen may be subsequently released into the chamber so that the desired $Ba_{0.725}Sr_{0.275}O$ forms upon the $TiO_2$ surface. Alternatively, the $TiO_2$ layer could be simultaneously exposed to Ba and Sr vapors in the appropriate amounts and oxygen so that the desired $Ba_{0.725}Sr_{0.275}O$ accumulates on the $TiO_2$ layer. Again, careful control should be maintained over the deposition operation here so that no more than one plane of the desired layer of $Ba_{0.725}Sr_{0.275}O$ is developed at this stage upon the $TiO_2$ layer and so that the pattern of $Ba_{0.725}Sr_{0.275}O$ deposited upon the $TiO_2$ layer is epitaxial and fully commensurate with the $TiO_2$ of the previously-grown initial $TiO_2$ plane.

Upon formation of the desired plane of $Ba_{0.725}Sr_{0.275}O$, a further plane of $TiO_2$ is grown upon the $Ba_{0.725}Sr_{0.275}O$ plane in accordance with the aforedescribed techniques used to grow $TiO_2$ onto the $Ba_{0.725}Sr_{0.275}O$ surface. Then, upon formation of the desired further plane of $TiO_2$, a further plane of $Ba_{0.725}Sr_{0.275}O$ is grown upon the further plane of $TiO_2$. Thereafter, single plane layers of $TiO_2$ and $Ba_{0.725}Sr_{0.275}O$ are grown in an alternating fashion atop one another until a cell height is reached at which no lattice strain appears in the last-grown layer, or plane, of $Ba_{0.725}Sr_{0.275}O$. In other words, any lattice strain which may exist at the $Ba_{0.725}Sr_{0.275}O/Ca_{0.64}Sr_{0.36}TiO_3$ interface is not as apparent as the surface of subsequently-formed layers of $TiO_2$ and $Ba_{0.725}Sr_{0.275}O$. Along these lines, it is believed that no such strain will appear following a build up of about four cell units of the $Ba_{0.725}Sr_{0.275}TiO_3$ perovskite structure upon the $Ca_{0.64}Sr_{0.36}TiO_3$ film 26.

Following the growth of the $Ba_{0.725}Sr_{0.275}TiO_3$ perovskite structure, $BaTiO_3$ can be grown upon the $Ba_{0.725}Sr_{0.275}TiO_3$ surface one cell unit layer-at-a-time by conventional MBE techniques so that each layer constructed at a stage of the build up process is one cell unit high. For example, the $Ba_{0.725}Sr_{0.275}TiO_3$ surface may be initially be exposed to Ti and Ba vapors and then to oxygen so that $BaTiO_3$ perovskite forms upon the strain-free surface. Alternatively, the $Ba_{0.725}Sr_{0.275}TiO_3$ surface can be exposed simultaneously to the Ti and Ba vapors and oxygen so that the $BaTiO_3$ perovskite forms and then settles upon the $Ba_{0.725}Sr_{0.275}TiO_3$ surface. In either instance, careful control of the MBE process is maintained so that the build up of successive layers of the perovskite is effected epitaxially. The growth of $BaTiO_3$ is continued until the desired thickness of $BaTiO_3$ is obtained.

Figure 7:
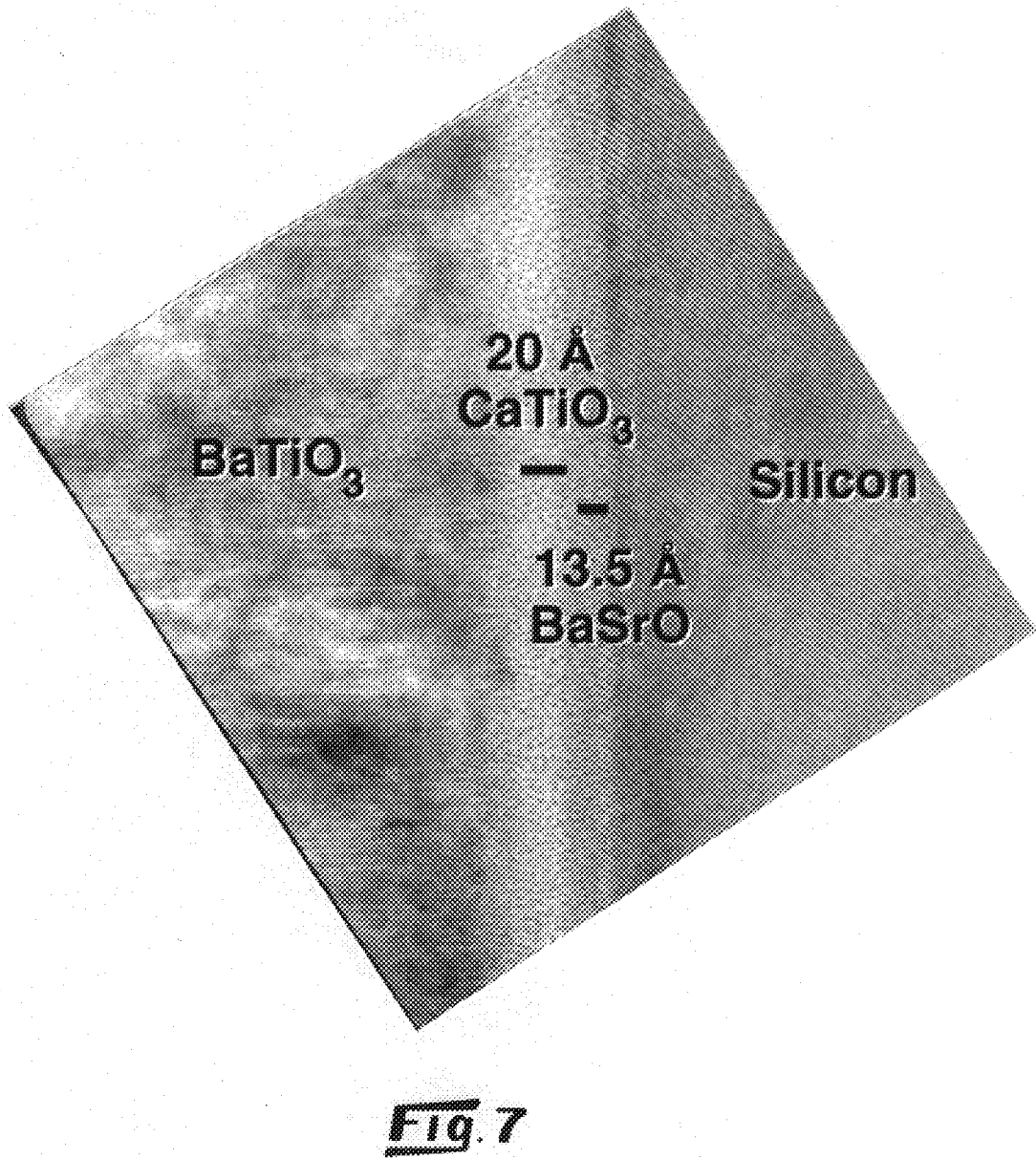
FIG. 7 is a TEM photograph of a $BaTiO_3/CaTiO_3/BaSrO/Si$ structure in accordance with an embodiment of the structure of the present invention.

To illustrate the ordered arrangement of a multiplane structure embodying the desirable features which can be achieved with the process described above, there is shown in FIG. 7 a transmission electron micrograph (TEM) of a cross section of a $BaTiO_3/CaTiO_3/BaSrO/Si$ structure in accordance with an embodiment of the structure of the present invention. The layer of BaSrO which directly contacts and is fully commensurate with the underlying substrate of silicon is four atoms thick, and the BaSrO interface with silicon is atomically sharp with no evidence that amorphous silica is present at that interface. By comparison, the layer of $CaTiO_3$ which directly contacts and is fully commensurate with the underlying layer of BaSrO is eight atoms thick. A layer of the perovskite $BaTiO_3$ directly contacts and is fully commensurate with the underlying layer of $CaTiO_3$. It can be seen within this FIG. 7 TEM that the atoms of the various layers are highly ordered and uniform and that the planes comprising the various layers of the FIG. 7 structure are substantially defect-free.

It will be understood that although the aforedescribed structure has been described as involving a build up of $BaTiO_3$ upon a semiconductor-based substrate, other perovskites can be constructed in accordance with the broader aspects of the invention. Such perovskites include those in the $BaTiO_3$ class such as $CaTiO_3$, $PbTiO_3$, $PbLaTiO_3$, $Pb(Zr Ti)O_3$, $(PbLa)(ZrTi)O_3$, $SrTiO_3$, $KNbO_3$, $KTaO_3$, $NaNbO_3$, $NaTaO_3$, $LiNbO_3$, $LiTaO_3$, $CaTiO_3$, $LaAlO_3$, $NaTaO_3$ and YBCO.

Although the build up of the structure 32 has been described as involving the use of an intermediate template layer 26 of $Ca_xSr_{1-x}TiO_3$ wherein x=0.64, we have found experimentially (i.e. verified through RHEED analysis) that in order to achieve the desired commensurate periodicity between sequentually-built single-plane layers, the ratio of Ca to Sr within the single plane layers of $Ca_xSr_{1-x}O$ may fall within a relatively broad range (e.g. wherein "x" may fall within the range of between 0.5 and 0.8). Accordingly, wherein x is described within the layer 26 of $Ca_xSr_{1-x}TiO_3$ in the aforedescribed structure as equal to 0.64, the value of "x" is not necessarily so limited.

Ferroelectric Considerations

Figure 5:
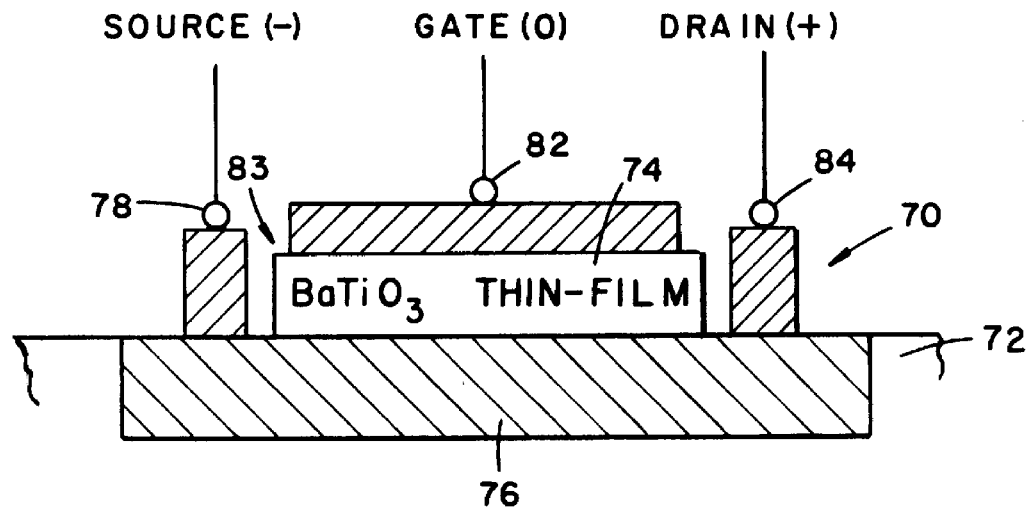
FIG. 5 is a schematic cross sectional view of a fragment of a ferroelectric field effect transistor (FFET) utilizing a perovskite thin film as a gate dielectric.

It is recognized in the art that ferroelectric materials, such as perovskites, can be advantageously used in solid state electrical components if incorporated therein in a manner which takes appreciable advantage of the ferroelectric and/or dielectric properties of the materials. For example and with reference to FIG. 5, there is shown a ferroelectric field effect transistor (FFET), indicated 70, including a base, or substrate 72 of Si and an overlayer 84 of the perovskite $BaTiO_3$. The transistor 70 is also provided with a source electrode 78, a drain electrode 80, a gate electrode 82, and a gate dielectric 83. The $BaTiO_3$ thin-film 84 (which comprises a portion of the gate dielectric 83) is sandwiched between the epilayer 76 and the remainder of the gate dielectric 83 so as to be positioned adjacent the epilayer 76. Since ferroelectric materials possess a permanent spontaneous electric polarization (electric dipole moment per cubic centimeter) that can be reversed by an electric field, the ferroelectric dipoles can be switched, or flipped, and the charge density and channel current can be modulated. Thus, the transistor 70 can be turned ON or OFF by the action of the ferroelectric polarization, and if used as a memory device, the transistor 70 can be used to read the stored information (+ or −, or "1" or "0") without ever switching or resetting (hence no fatigue).

Figure 6:
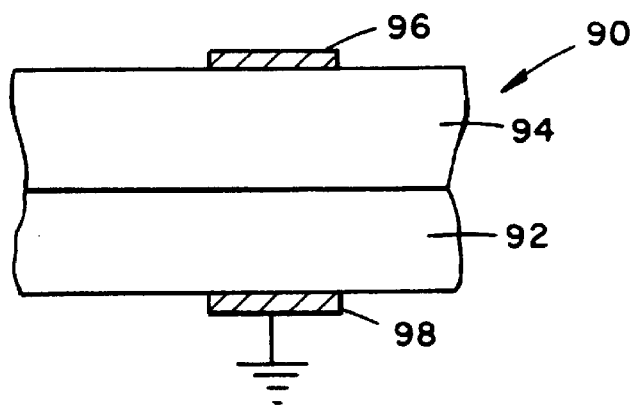
FIG. 6 is a schematic cross sectional view of a fragment of a capacitor utilizing a perovskite layer juxtaposed with a layer of silicon.

Similarly, there is schematically depicted in FIG. 6 a capacitor 90 for a dynamic random access memory (DRAM) circuit including a silicon layer 92 and an oxide (dielectric) layer 94 which are in superposed relationship and which are sandwiched between a gate 96 and a ground terminal 98. In use, an information-providing signal is collected from the capacitor 90 by measuring the current of the capacitor 90 during a discharge cycle. Therefore, the greater the dielectric constant exhibited by the oxide layer 94, the greater the charge-storage capacity of the capacitor 90. Since ferroelectric materials, such as perovskites, are known to be capable of exhibiting relative large dielectric constants (e.g. at least 1000), a perovskite-including capacitor which takes appreciable advantage of the desirable dielectric properties of the perovskite would be advantageous.

Heretofore, however, in the case of each of the ferroelectric field effect transistors and capacitors or inactive gate transistors which incorporate a ferroelectric material, such as a perovskite, the devices are incapable of taking appreciable advantage of the ferroelectric and/or dielectric properties of the ferroelectric materials. The FFETs constructed to date have been unsatisfactory in performance, and the capacitors and inactive gate transistors constructed to date have been too leaky and thus incapable of holding a charge for a lengthy period of time. Factors which are responsible for the unsatisfactory performance of FFETs or ferroelectric material-including capacitors or inactive gate transistors include the impurities (e.g. amorphous nature) of the crystalline structure of the material or the interface between the ferroelectric material and the underlying silicon which interferes with the flow of current within the device. For example, some interface materials employed in FFETs can screen and thereby trap charge that could otherwise contribute to the depleted or accumulated state of the current-carrying channel of the device.

The aforedescribed process of the present invention can be used to incorporate a ferroelectric material, i.e. a perovskite, in a solid state electrical component, such as a FFET and a capacitor for a RAM or DRAM circuit, during the construction of the component which enables the component to take appreciable advantage of the ferroelectric and/or dielectric properties of the ferroelectric material during use. In other words, by building up a desired perovskite directly upon silicon with the use of the template structure as described above, the crystalline quality of the resulting perovskite is high, and the interface between the perovskite and the silicon is stable. Along these lines, the few layers of non-perovskite interface material which provide the template structure upon which the perovskite is constructed are commensurate with less than $1.0 \times 10^4$ site fraction errors thereby achieving a monolithic interface structure. Thus, interface trap densities of less than $10^{11}$ per square cm are achieved.

When applying the foregoing to FFET construction and with reference again to FIG. 5, the overlayer 84 of the perovskite $BaTiO_3$ is grown upon the substrate 72 of Si in accordance with the process of the present invention to provide the FFET 70 with an overlayer 72 of high crystalline quality and with a stable perovskite/silicon interface. Similarly, when applying the foregoing to capacitor construction and with reference again to FIG. 6, the oxide layer 94 of the capacitor 90 can be provided by the perovskite $BaTiO_3$ grown upon the silicon layer 92 in accordance with the process of the present invention to provide the capacitor with an oxide layer 94 of high crystalline quality and a stable oxide/silicon interface structure. This construction, when suitably modified as previously noted, is also applicable to silicon-germanium-based devices.

Moreover, by exactly matching the lattice parameters of an overgrowing oxide with those of silicon, heteroepitaxy with a perovskite structure like $BaTiO_3$ can be accomplished avoiding interfacial strain and thereby improving the interfacial coherence and crystalline quality of the silicon/ferroelectric thin-film structure. Furthermore, the long range structural coherence of single crystal $BaTiO_3$ thin films on silicon improve the dielectric properties of thin film memory devices and significantly improve their fatigue life in read-write-restore cycles of a conventional memory circuit which is normally limited by the formation and interaction of both line and planar defects in polycrystalline materials presently used. Still further, the absence of internal grain boundaries, strain, and electrostatic field effects commonly associated with the grain boundaries will significantly extend the useful life of a thin film ferroelectric memory structure.

Figure 8:
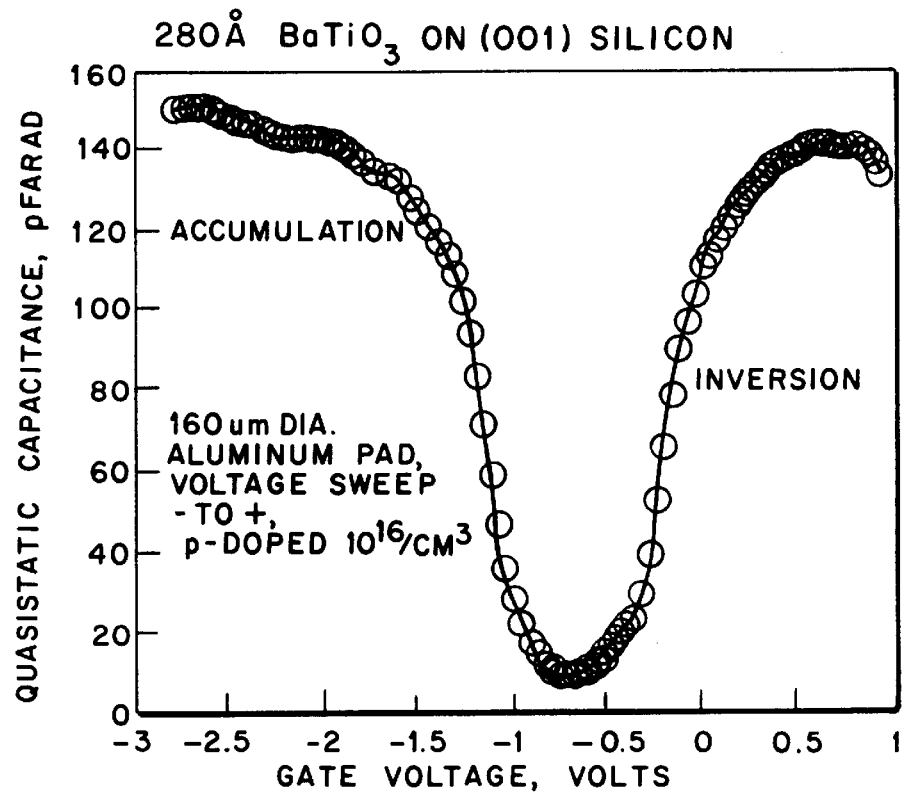
FIG. 8 is a graph wherein capacitance is plotted against gate voltage in tests performed upon an embodiment of a structure in accordance of the present invention.
Figure 9:
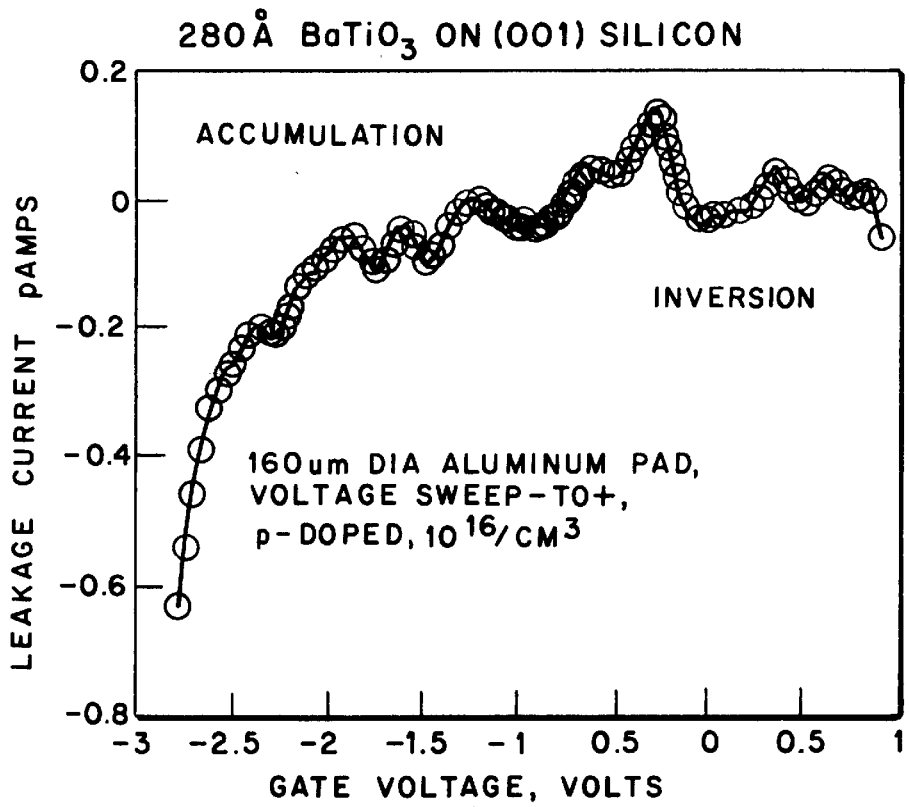
FIG. 9 is a graph wherein leakage current is plotted against gate voltage in tests performed upon the structure embodiment tested in FIG. 8.
Figure 10:
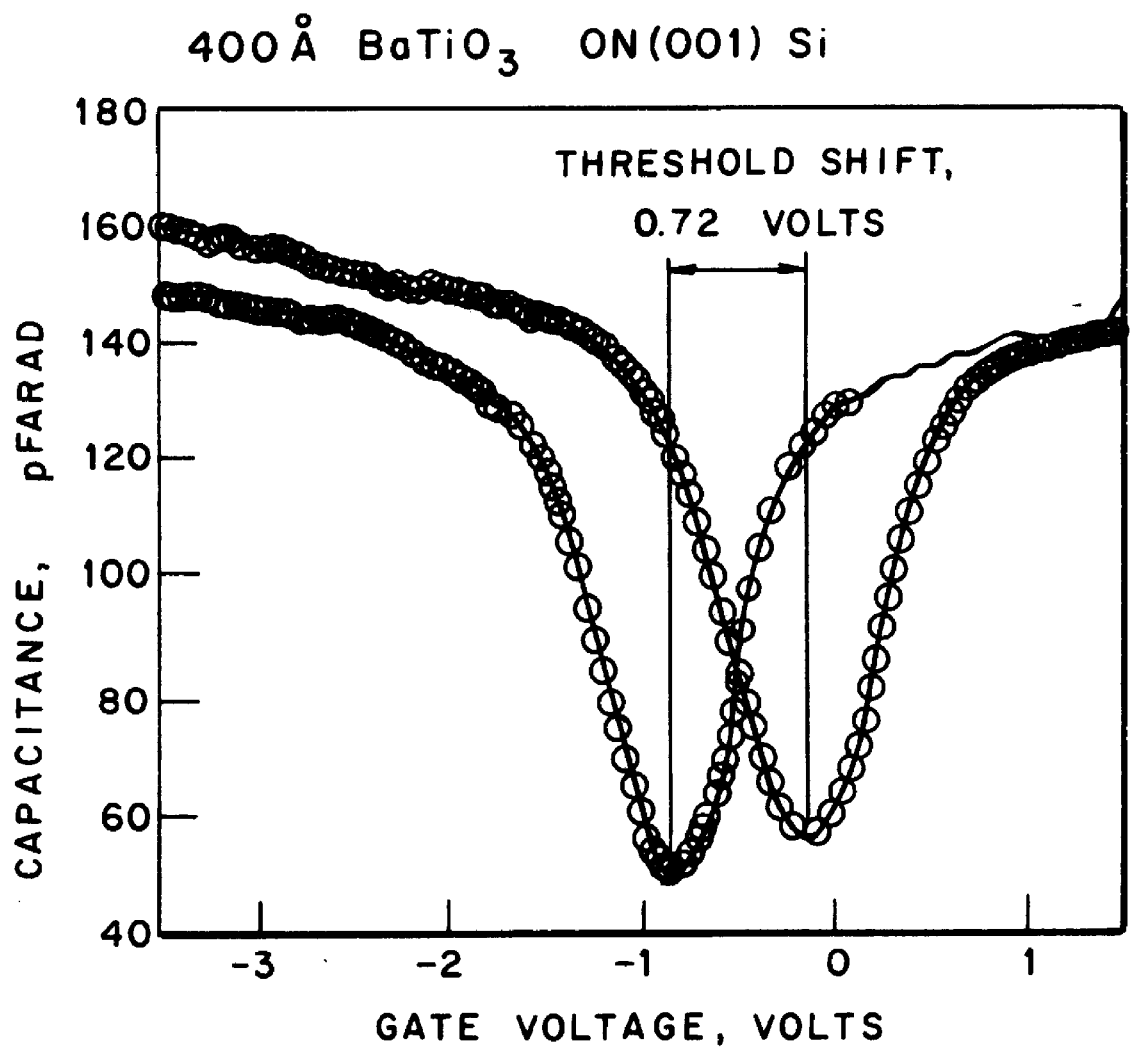
FIG. 10 is a graph depicting the test results involving a polarization-induced shift of the capacitance voltage characteristics of an embodiment of a structure in accordance with the present invention.

To substantiate that an embodiment of a structure of the present invention does indeed possess the desirable qualities addressed above, there is provided in FIGS. 8–10 graphs of data collected from samples comprised of a layer of $BaTiO_3$ constructed atop a silicon substrate in accordance with an embodiment of the method of the present invention. In particular, FIG. 8 is a graph depicting the measured capacitance versus gate voltage of a layer of $BaTiO_3$ (0.280 nm in thickness) constructed upon silicon. The curve drawn through the plotted points characterize that of a substance suitable for use as a capacitor (e.g. an MOS capacitor). Along the same lines, the FIG. 9 plot which shows the leakage current versus gate voltage of the material illustrates a low leakage current (i.e. less than $10^{-9}$ amps per square centimeters at 3.0 volts)—a quality indicting that the material (as a capacitor) will hold a charge for an appreciable period of time. Furthermore, the curves depicted in FIG. 10 evidence a threshold voltage shift (of about 1.0 volt) as a consequence of a polarization reversal in the ferroelectric gate oxide. Therefore, when the structure is used in conjunction with a FFET (such as the FFET 70 of FIG. 5), the polarization reversal switches the silicon and thus switches the device ON or OFF.

Still further, a sample capacitor construction (constructed in accordance with the method of the present invention) including a thin-film of $BaTiO_3$ (of 0.280 nm in thickness) grown onto an interface thin-film of $CaTiO_3$ (of 0.40 nm in thickness) grown onto a silicon substrate has been found to possess the following MOS capacitor characteristics: The flat band voltage measured −1.027 volts; the threshold voltage measured −0.29 volts; the Al/Si workfunction (volts) measured −0.95 volts; the interface charge (coul/cm$^2$) measured $6.04 \times 10^{-8}$ coul/cm$^2$; and the trap density (1/cm$^2$) measured $3.77 \times 10^{11}$. In addition, the resistivity-voltage, has been found to be $10^{13}$ohm-cm, and the leakage current is less than $1 \times 10^{-9}$ amps/cm$^2$ at 3 volts. The foregoing measurements were made with aluminum electrodes, 160 μm pads, p-doped $10^{16}$/cm$^2$.

It follows from the foregoing that a FFET and a process for constructing the FFET has been described which improves upon conventional FET structure. In particular, a monolithic structure and process has been described which accommodates the lattice mismatch between silicon and a perovskite, such as $BaTiO_3$, if a single crystal of the perovskite is to be grown upon silicon. After limiting the thickness of the initially-grown alkaline earth oxide film to two unit cells (e.g. 2×0.543 nm, or 1.068 nm), a unique transition is made to a perovskite structure, $CaTiO_3$ (having a cubic lattice parameter of 0.380 nm) which can be alloyed with Sr to exactly lattice match silicon. Since $CaTiO_3$ and $SrTiO_3$ are mutually soluble in each other and have a cubic phase with continuously variable lattice parameter from 0.380 nm for $CaTiO_3$ to 0.391 nm for $SrTiO_3$, the composition $Ca_xSr_{1-x}TiO_3$ wherein x=0.64 has a crystalline structure which, with a 45° rotation of its orientation, lattice-matches the [110] spacing of silicon (0.384 nm). $BaTiO_3$ or $SrTiO_3$ are simple cubic perovskites and when grown epitaxially upon $Ca_xSr_{1-x}TiO_3$ on BaSrO/Si as the active component in a composite ferroelectric structure developed on silicon, are the central elements of a thin film memory circuit.

Similarly, it follows from the foregoing that a ferroelectric material-including capacitor or an inactive gate transistor and a process for constructing the device has been described which improves upon conventional capacitor or inactive gate transistor. Whereas in a FFET, the ferroelectric material incorporated therein is used in a ferroelectric state as a ferro-gated transistor, in applications such as a capacitor used in a DRAM circuit or an inactive gate transistor, the ferroelectric material is used in a non-ferroelectric state, but as a high dielectric constant configuration for inactive gate transistors or capacitors.

It will be understood that numerous modifications and substitutions can be had to the aforedescribed embodiments without departing from the present invention. For example, while much of the foregoing discussion has focused upon the ferroelectric qualities of a perovskite constructed on a semiconductor-based material, it will be understood by one skilled in the art that many comparable devices can be constructed in accordance with the principles of this invention which possess other desirable characteristics. For example, comparable devices can be constructed which are piezoelectric in nature, pyroelectric in nature or electro-optic in nature. Accordingly, the aforedescribed embodiments are intended for the purpose of illustration and not as limitation.

We claim:

1. A monolithic crystalline structure comprising:

a semiconductor substrate having a surface; and a film overlying the surface of the substrate wherein the film consists of an $ABO_3$ material having at least one AO constituent plane and at least one $BO_2$ constituent plane wherein said $ABO_3$ material is either arranged in a cube-on-cube relationship with the surface of the substrate or has a lattice parameter which closely approximates the quotient of the lattice parameter of the surface of the substrate divided by the square root of 2.0; and the film being arranged upon the surface of the substrate so that a first single plane consisting of a single atomic layer of said AO constituent of the $ABO_3$ material overlies and is commensurate with the surface of the substrate and a second single plane consisting of a single atomic layer of said $BO_2$ constituent of the $ABO_3$ material overlies and is commensurate with the first single plane of AO.

2. A process for growing a film onto the surface of a semiconductor-based material having a surface, the process comprising the steps of:

a) providing an atomically-clean substrate of semiconductor-based material having a surface;

b) positioning the substrate within an oxygen-free environment;

c) selecting an alkaline earth oxide having a lattice parameter which closely matches the lattice parameter of the material of the semiconductor-based substrate;

d) growing a film of the alkaline earth oxide upon the surface of the substrate wherein the alkaline earth oxide of the film being grown in this step d) is commensurate with the surface of the semiconductor-based substrate;

e) selecting an $ABO_3$ material having a lattice parameter which closely approximates either the lattice parameter of the substrate material or the quotient of the lattice parameter of the substrate material divided by the square root of 2.0 and wherein the $ABO_3$ material has a crystalline form comprised of two metal oxide planes wherein the metal oxide of one of the two metal oxide planes is comprised of $BO_2$ so that the metal element B of the $BO_2$ plane provides a small cation in the crystalline structure of the $ABO_3$ material and wherein the metal oxide of the other of the two metal oxide planes is comprised of AO so that the metal element B provides a large cation in the crystalline structure of the $ABO_3$ material;

f) growing a single plane of $BO_2$ upon the alkaline earth oxide film wherein the $BO_2$ of the single plane is epitaxial and commensurate with the alkaline earth oxide of the alkaline earth oxide film; and g) growing a single plane of AO upon the $BO_2$ plane so that the metal oxide AO is commensurate with the $BO_2$ of the previously-grown $BO_2$ plane and wherein the orientation of the grown $ABO_3$ material is either in a cube-on-cube relationship with the substrate surface or is rotated 45° with respect to the surface of the substrate so that (001) $ABO_3$ is parallel to (001) substrate surface and [100] $ABO_3$ is parallel to [110] substrate surface.

3. A monolithic crystalline structure comprising:

a semiconductor substrate having a material surface provided by a face-centered-cubic lattice structure like that of silicon or silicon-germanium; and an epitaxial film overlying the material surface of the substrate wherein the epitaxial film includes a perovskite having a lattice parameter which closely approximates the quotient of the lattice parameter of the material surface divided by the square root of 2.0 and wherein the perovskite has a crystalline form comprised of two constituent metal oxide planes wherein the metal oxide of one of the two constituent metal oxide planes is comprised of $TiO_2$ so that the Ti metal of the $TiO_2$ plane provides a small cation in the perovskite crystalline structure and wherein the metal oxide of the other of the two constituent metal oxide planes includes another metal which provides a large cation in the perovskite crystalline structure;

the perovskite of the epitaxial film being arranged upon the material surface so that a first single plane consisting of the perovskite constituent $TiO_2$ is epitaxial and commensurate with the material surface of the substrate, and a second single plane consisting of the other of the two constituent metal oxide planes of the perovskite crystalline structure is commensurate with the first single plane of $TiO_2$ and wherein the orientation of the perovskite of the epitaxial film is rotated 45° with respect to the orientation of the material surface of the substrate.

4. The structure as defined in claim 3 wherein the epitaxial film includes a layup of perovskite comprised of a plurality of single planes consisting of $TiO_2$ and a plurality of single planes consisting of the other of the two constituent metal oxides planes of the perovskite crystalline structure wherein the single planes of $TiO_2$ and the single planes of the other of the two constituent metal oxides planes of the perovskite crystalline structure alternate with one another as a path is traced through the layup from the material surface of the substrate and each of the aforesaid single planes is commensurate with the corresponding surface upon which it overlies.

5. The structure as defined in claim 4 wherein the layup of perovskite is at least about twelve cell units in thickness as measured therethrough from the material surface of the substrate.

6. The structure as defined in claim 3 wherein the perovskite of the film is a perovskite of the $BaTiO_3$ class.

7. The structure as defined in claim 6 wherein the perovskite of the film is a first perovskite and the structure further comprises a second perovskite directly contacting and commensurate with the first perovskite.

8. The structure as defined in claim 7 wherein the perovskite of the first perovskite is $CaTiO_3$ and the perovskite of the second perovskite is $BaTiO_3$.

9. The structure as defined in claim 3 further including a thin film of an intermediate material having a sodium chloride-type lattice structure interposed between the material surface of the substrate and the film of perovskite, and said intermediate material directly contacts and is commensurate with the material surface of the substrate, and the first single plane of the perovskite constituent $TiO_2$ directly contacts and is commensurate with the alkaline earth oxide and the second single plane consisting of the other of the two constituent metal oxide planes of the perovskite crystalline structure is commensurate with the first single plane of $TiO_2$ and wherein the orientation of the second single plane is rotated 45° with respect to the orientation of said intermediate material.

10. A process for growing a perovskite film onto the surface of a semiconductor-based material wherein the material surface thereof is provided by a face-centered-cubic (fcc) lattice structure like that of silicon or silicon-germanium, the process comprising the steps of:

19 a) providing an atomically-clean substrate of semiconductor-based material having a material surface which is provided by an fcc lattice structure like that of silicon or silicon-germanium;

b) positioning the substrate within an oxygen-free environment;

c) selecting an alkaline earth oxide having a lattice parameter which closely matches the lattice parameter of the material surface of the semiconductor-based substrate;

d) growing a film of the alkaline earth oxide upon the material surface wherein the alkaline earth oxide of the film being grown in this step d) is epitaxial and fully commensurate with the material surface of the semiconductor-based substrate;

e) selecting a perovskite having a lattice parameter which closely approximates the quotient of the lattice parameter of the material surface divided by the square root of 2.0 and wherein the perovskite has a crystalline form comprised of two metal oxide planes wherein the metal oxide of one of the two metal oxide planes is comprised of $TiO_2$ so that the Ti metal of the $TiO_2$ plane provides a small cation in the perovskite crystalline structure and wherein the metal oxide of the other of the two metal oxide planes includes another metal which provides a large cation in the perovskite crystalline structure;

f) growing a single plane of $TiO_2$ upon the alkaline earth oxide film wherein the $TiO_2$ of the single plane is epitaxial and commensurate with the alkaline earth oxide of the alkaline earth oxide film; and g) growing a single plane comprised of the other of the two metal oxide planes of the perovskite crystalline structure upon the $TiO_2$ plane so that the metal oxide of the other of the two metal oxide planes is epitaxial and commensurate with the $TiO_2$ of the previously-grown $TiO_2$ plane and wherein the orientation of the grown perovskite is rotated 45° with respect to the material surface of the substrate so that (001) perovskite is parallel to (001) material surface and [100] perovskite is parallel to [110] material surface.

11. The process as defined in claim 10 wherein steps involving a growing of a single commensurate plane of $TiO_2$ and growing a single commensurate plane of the other of the two metal oxide planes of the perovskite crystalline structure are repeated in sequence so that a layup of perovskite comprised of alternating layers of $TiO_2$ and the metal oxide of the other of the two metal oxide planes is grown upon the material surface with commensurate periodicity until a layup of perovskite having a thickness which is at least as large as the critical thickness of the perovskite is obtained.

12. The process as defined in claim 12 wherein the growth of said layup of perovskite is followed by the step of growing an epitaxial and commensurate film comprised of bulk perovskite upon said layup.

13. The process as defined in claim 10 wherein the perovskite grown upon the alkaline earth oxide is a perovskite of the $BaTiO_3$ class.

14. The process as defined in claim 13 wherein the perovskite grown upon the alkaline earth oxide is $Ba_{0.75}Sr_{0.25}TiO_3$.

15. A structure formed by the process of claim 10.

16. A process for growing an epitaxial film of a perovskite onto a structure including a substrate of semiconductor-based material and a film of alkaline earth oxide which directly contacts and is commensurate with the material of the substrate, the process comprising the steps of:

20 a) providing a structure including a substrate of semiconductor-based material and a film of alkaline earth oxide which directly contacts and is commensurate with the material of the substrate;

b) positioning the structure within an oxygen-free environment;

c) selecting a first perovskite having a lattice parameter which closely approximates that of the alkaline earth oxide wherein the first perovskite has a crystalline form comprised of two metal oxide planes wherein the metal oxide of one of the two metal oxide planes is comprised of $TiO_2$ so that the Ti metal of the $TiO_2$ plane provides a small cation in the perovskite crystalline structure and wherein the metal oxide of the other of the two metal oxide planes includes another metal which provides a large cation in the perovskite crystalline structure;

d) growing a single plane of $TiO_2$ upon the surface of the alkaline earth oxide film wherein the $TiO_2$ of the single plane is epitaxial and commensurate with the alkaline earth oxide; and e) growing a single plane comprised of the other of the two metal oxide planes of the perovskite crystalline structure upon the $TiO_2$ plane so that the metal oxide of the other of the two metal oxide planes is epitaxial and commensurate with the $TiO_2$ of the previously-grown $TiO_2$ plane and wherein the orientation of the single plane grown in this step is rotated 45° with respect to the alkaline earth oxide upon which the $TiO_2$ plane of step d) is grown so that the (001) plane of the first perovskite is parallel to the (001) plane of alkaline earth oxide and the [100] direction of the first perovskite is parallel to the [110] direction of the alkaline earth oxide.

17. The process as defined in claim 16 wherein step e) is followed by the step of f) repeating steps d) and e) in sequence so that a layup of the first perovskite comprised of alternating layers of $TiO_2$ and the metal oxide of the other of the two metal oxide planes is grown upon the alkaline earth oxide surface until a commensurate layup of the first perovskite of about three cell units in thickness is obtained.

18. The process as defined in claim 17 wherein step f) is followed by the steps of:

g) selecting a second perovskite having a lattice parameter which closely matches the lattice parameter of the first perovskite and wherein the second perovskite has a crystalline form comprised of two metal oxide planes wherein the metal oxide of one of the two metal oxide planes of the crystalline form of the second perovskite is comprised of $TiO_2$ so that the Ti metal of the $TiO_2$ plane provides a small cation in the crystalline structure of the second perovskite and wherein the metal oxide of the other of the two metal oxide planes of the crystalline form of the second perovskite includes another metal which provides a large cation in the crystalline structure of the second perovskite;

h) growing a single plane of $TiO_2$ upon the other of the two metal oxide planes of the previously-grown first perovskite wherein the $TiO_2$ of the single plane grown in this step is epitaxial and commensurate with the metal oxide of the surface upon which it is grown; and i) growing a single plane comprised of the other of the two metal oxide planes of the crystalline form of the second perovskite upon the $TiO_2$ plane grown in step h) so that the metal oxide of the other of the two metal oxide planes of the crystalline form of the second perovskite is epitaxial and fully commensurate with the TiO$_2$ of the TiO$_2$ plane grown in step h).

19. The process as defined in claim 16 wherein step i) is followed by the step of j) repeating steps h) and i) in sequence so that a layup of the second perovskite comprised of alternating layers of TiO$_2$ and the metal oxide of the other of the two metal oxide planes is grown upon the previously-grown layup of the first perovskite until a layup of the second perovskite of at least about twelve cell units in thickness is obtained.

20. The process as defined in claim 16 wherein the composition of the alkaline earth oxide upon which the first perovskite is grown is Ba$_{0.725}$Sr$_{0.275}$O, the composition of the first perovskite is Ca$_{0.64}$Sr$_{0.36}$TiO$_3$, and the composition of the second perovskite is of the BaTiO$_3$ class.

21. The process as defined in claim 20 wherein the composition of the second perovskite is Ba$_{0.75}$Sr$_{0.25}$TiO$_3$.

22. A structure formed by the process of claim 16.

23. In a solid state electrical component including a substrate of a semiconductor-based material providing a material surface provided by a face-centered-cubic (fcc) lattice structure and a layup of one perovskite oxide overlying the material surface wherein the one perovskite oxide has a crystalline form comprised of two metal oxide planes wherein the metal oxide of one of the two metal oxide planes of the crystalline form is comprised of TiO$_2$ so that the Ti metal of the TiO$_2$ plane provides a small cation in the crystalline structure of the one perovskite oxide and wherein the metal oxide of the other of the two metal oxide planes of the crystalline form includes a large cation in the crystalline structure of the one perovskite oxide, the improvement characterized in that:

the perovskite oxide in the layup of perovskite oxide is comprised of a plurality of first planes each comprised entirely of TiO$_2$ and a plurality of second planes each comprised entirely of metal oxide wherein the metal of the metal oxide plane includes the large cation in the crystalline structure of the perovskite structure, and the first and second planes of the perovskite oxide of the layup alternate with one another as a path is traced therethrough from the material surface; and an intermediate, epitaxial and commensurate interfacial film of another perovskite is disposed between the material surface and the layup of the perovskite oxide wherein the perovskite of the interfacial film has a lattice parameter which closely approximates the quotient of the lattice parameter of the material surface divided by the square root of 2.0.

24. The improvement as defined in claim 23 wherein the perovskite of the interfacial film has a crystalline form comprised of two metal oxide planes wherein the metal oxide of one of the two metal oxide planes is comprised of TiO$_2$ so that the Ti metal of the TiO$_2$ plane provides a small cation in the perovskite crystalline structure and wherein the metal oxide of the other of the two metal oxide planes includes another metal which provides a large cation in the perovskite crystalline structure, and the perovskite of the interfacial film is comprised of a plurality of first single planes each comprised entirely of TiO$_2$ and a plurality of second single planes each comprised entirely of metal oxide wherein the metal of the metal oxide plane includes the large cation in the crystalline structure of the perovskite structure, and the first single planes and the second single planes of the perovskite of the interfacial film alternate with one another as a path is traced therethrough from the material surface; and wherein the orientation of the perovskite of the interfacial film is rotated 45° with respect to the material surface so that the (100) plane of the perovskite of the interfacial film is parallel to the (001) plane of the material surface and the [100] direction of the perovskite of the interfacial film is parallel to the [110] direction of the material surface.

25. The improvement as defined in claim 24 further comprising a film of alkaline earth oxide interposed between the material surface and the interfacial film and wherein said film of alkaline earth oxide is epitaxial and commensurate with the material surface.

26. The improvement as defined in claim 25 wherein the semiconductor-based material is comprised of silicon or a silicon-germanium alloy.

27. The improvement as defined in claim 22 wherein the perovskite oxide of the layup is adapted to exhibit ferroelectric, piezoelectric, pyroelectric, electro-optic or large dielectric properties during use of the component.

28. The improvement as defined in claim 27 wherein the perovskite oxide of the layup is adapted to exhibit a high dielectric constant during use of the component, and the dielectric constant is at least an order of magnitude greater than that of silica.

29. The improvement as defined in claim 22 wherein the component is a ferroelectric field-effect transistor including a base substrate of silicon, a source electrode and a drain electrode, a gate electrode and a gate dielectric, and the gate dielectric includes the perovskite oxide of the layup, and the perovskite oxide is interposed between the silicon and the remainder of the gate dielectric, and the interfacial film is disposed between the perovskite oxide layup and the silicon.

30. A ferroelectric field-effect transistor including a base substrate of silicon, a source electrode, a drain electrode, a gate electrode, and a gate dielectric, the improvement characterized in that:

the gate dielectric includes an epitaxial and commensurate template film of one perovskite oxide overlying and commensurate with the silicon and an epitaxial and commensurate thin film of another perovskite oxide directly contacting and commensurate with said one perovskite oxide film.

31. The improvement as defined in claim 30 further comprising a thin film of an alkaline earth oxide interposed between the surface of the silicon and said one perovskite oxide film.

32. The improvement as defined in claim 30 wherein said another perovskite oxide is of the BaTiO$_3$ class of oxides.

33. A monolithic crystalline structure comprising:

a semiconductor substrate having a surface; and a multilayer commensurate film overlying the surface of the substrate wherein the film consists of a first commensurate stratum of single plane layers of an alkaline earth oxide (AO) and having a sodium chloride-type lattice structure and a second commensurate stratum of single plane layers of an oxide material (A'BO$_3$) so that the multilayer film arranged upon the substrate surface can be designated (AO)$_n$(A'BO$_3$)$_m$ wherein n and m are integer repeats of single plane commensurate oxide layers; and wherein n has been selected to prevent a hydration reaction of the AO stratum with water vapor.

* * * * *

UNITED STATES PATENT AND TRADEMARK OFFICE
CERTIFICATE OF CORRECTION

PATENT NO. : 5,830,270
DATED : November 3, 1998
INVENTOR(S) : Rodney Allen McKee et al It is certified that error appears in the above-indentified patent and that said Letters Patent is hereby corrected as shown below:

In line 1 of the Title (appearing on the first/cover page and in column 1, line 1, of the patent), "CATIO3" should be --CaTiO3--.

In column 1, between the heading "Background of the Invention" appearing on line 7 and the paragraph of text beginning on line 8, the following paragraph should be inserted:
--This invention was made with Government support under Contract No. DE-AC05-96OR22464 awarded by the U.S. Department of Energy to Lockheed Martin Energy Research Corporation, and the Government has certain rights in the invention.--

In column 14, line 16, "84" should be --74--.
In column 14, line 18, "80" should be --84--.
In column 14, line 19, "84" should be --74--.

Signed and Sealed this

Twenty-fourth Day of August, 1999

Attest:

Q. TODD DICKINSON

Attesting Officer

Acting Commissioner of Patents and Trademarks